United States Patent [19]

Ofek

[11] Patent Number: 4,864,303
[45] Date of Patent: Sep. 5, 1989

[54] ENCODER/DECODER SYSTEM AND METHODOLOGY UTILIZING CONSERVATIVE CODING WITH BLOCK DELIMITERS, FOR SERIAL COMMUNICATION

[75] Inventor: Yoram Ofek, Urbana, Ill.

[73] Assignee: Board of Trustees of the University of Illinois, Urbana, Ill.

[21] Appl. No.: 14,638

[22] Filed: Feb. 13, 1987

[51] Int. Cl.$^4$ ............................................. H03M 7/42
[52] U.S. Cl. ....................................... 341/95; 341/58; 341/106
[58] Field of Search .................. 340/347 DD; 360/39, 360/40; 375/110, 113, 116; 341/55, 58, 73, 95, 106

[56] References Cited

U.S. PATENT DOCUMENTS

| | | | |
|---|---|---|---|
| 4,387,364 | 6/1983 | Shirota | 340/347 DD |
| 4,598,267 | 7/1986 | Fukuda | 340/347 DD |
| 4,606,056 | 8/1986 | Perloff | 375/110 |
| 4,626,826 | 12/1986 | Fukuda et al. | 340/347 DD |

Primary Examiner—William M. Shoop, Jr.
Assistant Examiner—Marc S. Hoff
Attorney, Agent, or Firm—Sitrick & Sitrick

[57] ABSTRACT

A system for serial communications is disclosed comprising an encoder for serially outputting conservative encoded codewords responsive to a parallel data input, and a decoder for outputting, in parallel, decoded data words responsive to the serially transmitted conservative encoded codewords.

The codewords are characterized in that the ratio is known between the total number of bits per codeword transmitted and the total number of transitions per codeword.

The encoder transforms each m-bit parallel data work into one n-bit codeword, where n is greater than m, such that every codeword has a known number of transitions and such that one of the transitions in the codeword has a predefined position.

Thereafter, the encoder converts each n-bit codeword from parallel to serial form for output onto a serial communications channel.

A method is taught for conservative encoding as follows.

First, identify and define the total set of q different datawords of m-bits each which can be transmitted.

Next, generate all possible conservative codewords of length n bits, where n is greater than m, such that each codeword has known number of transitions, where one transition has a predefined position.

Then select a subset of q different codwords from the possible conservative codewords.

Finally, create a mapping of each dataword to one corresponding codword.

The inverse mapping will relate each codeword to the corresponding dataword.

46 Claims, 9 Drawing Sheets

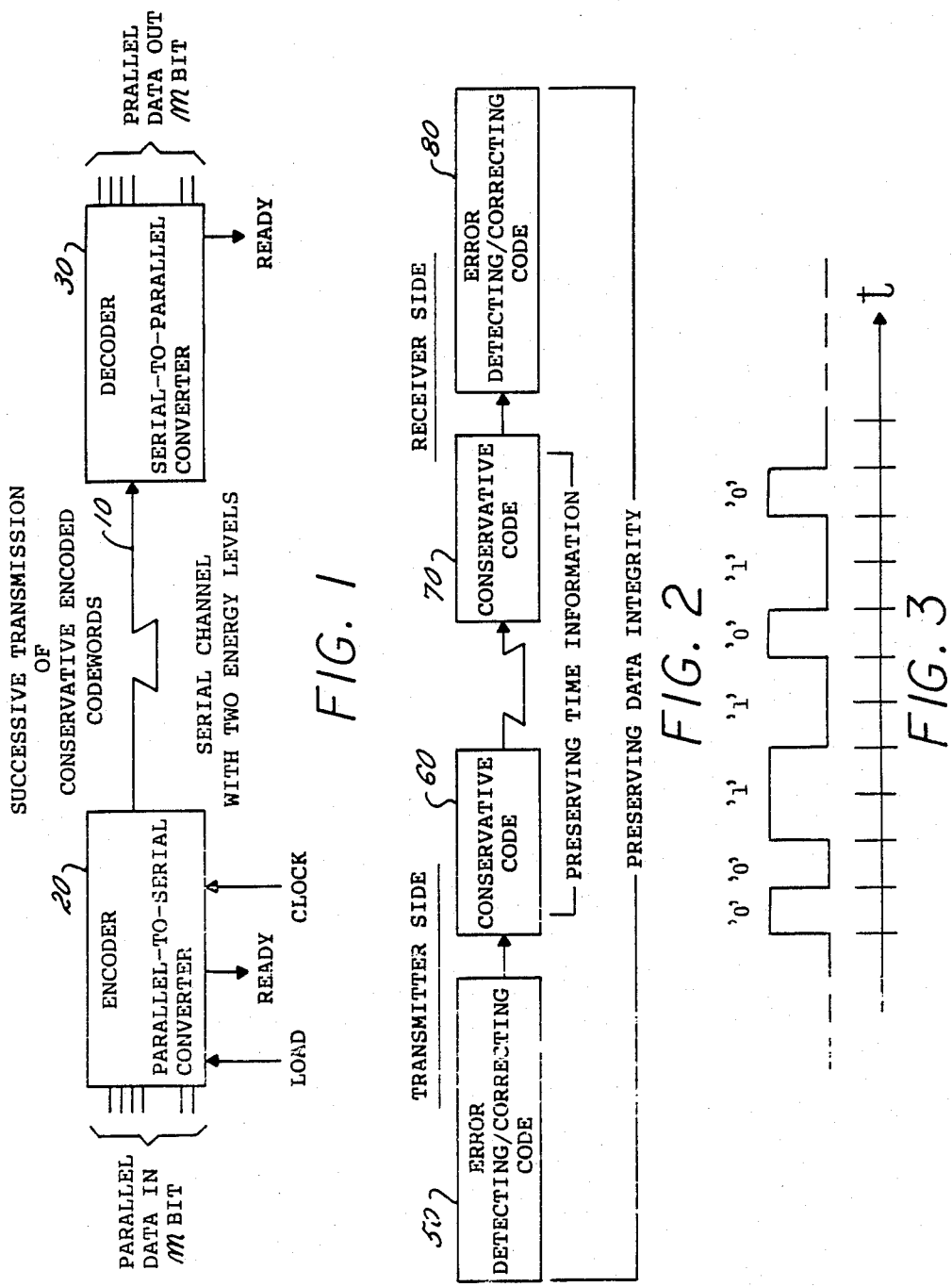

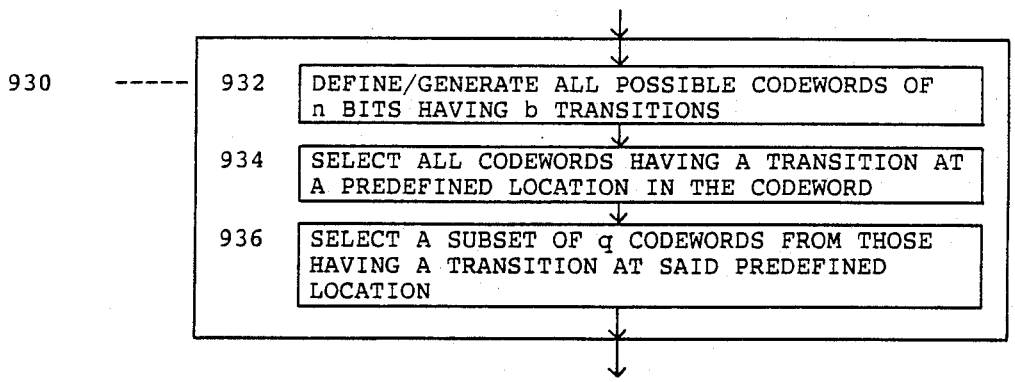
FIG. 13C    FIG. 13b
(alternative to step 934 of FIG. 13B)
935 | SELECT ALL CODEWORDS HAVING A TRANSITION AFTER THE $n^{th}$ BIT LOCATION IN THE CODEWORDS
FIG. 13c
(EXPANSION OF STEPS 960, 980, from FIG. 13A)
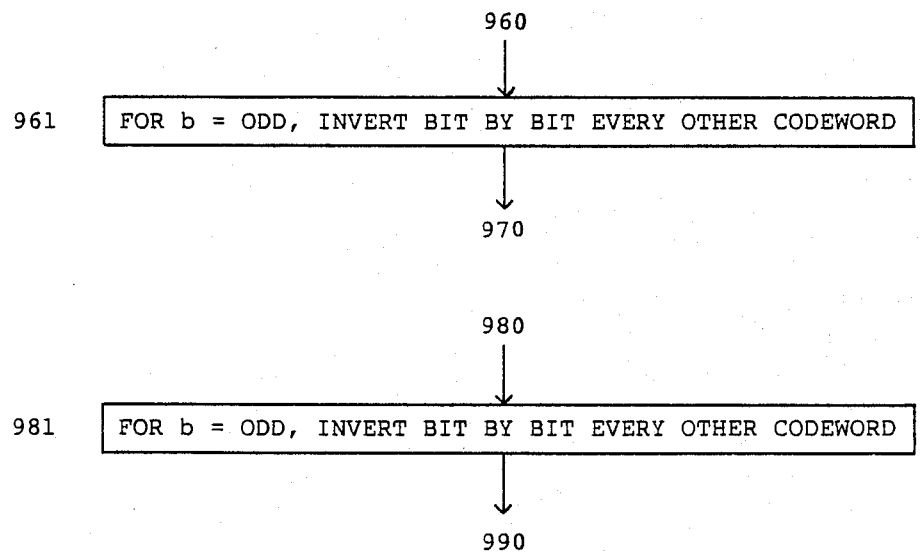
FIG. 13d

ENCODER/DECODER SYSTEM AND METHODOLOGY UTILIZING CONSERVATIVE CODING WITH BLOCK DELIMITERS, FOR SERIAL COMMUNICATION

This invention relates to high bandwidth communications interfaces and more praticularly to a very high speed serial digital electronic interface to very high speed communications over a high bandwidth medium.

In prior systems designs of digital serial interfaces, the receiver's clock was explicitly recovered from the incoming serial bit stream such as with a phase-locked loop. This clock was then used for the serial-to-parallel conversion. Some of these prior systems utilized Manchester, biphase, near-balanced block code, and non return to zero techniques.

None of these preexistant coding schemes had a fixed ratio of transitions to the total numbers of bits, and therefore made it very difficult to decode the incoming serial information without the use of a phase-locked loop. These prior systems created a bottleneck in high speed communications, such as with an optical communication system using fiber optics.

Where interface bandwidths approach one gigabit per second, the systems bottleneck is the digital electronic interface. Prior systems of digital serial interface had many problems, including excessive delays in critical timing paths, clock skew problems, and excessively long training periods associated with a phase-locked loop when decoding and performing serial-to-parallel conversion, which reduces the efficiency of sending short messages.

SUMMARY

In accordance with the illustrated embodiment of the present invention, a methodology is provided utilizing conservative encoding/decoding techniques, such that the transmitted serial code stream has a known ratio between the total number of bits to the total number of transitions. This is achieved by having a known number of transitions in each block of code. These techniques also provide a known delimiting transition (i.e. rising or falling edge) at a known position of each block of serial code.

A system for serial communications is disclosed comprising an encoder for serially outputting conservative encoded codewords responsive to a parallel data input, and a decoder for outputting, in parallel, decoded data words responsive to the serially transmitted conservative encoded codewords.

The codewords are characterized in that the ratio is known between the total number of bits per codeword transmitted and the total number of transitions per codeword.

The encoder transforms each m-bit parallel data word into one n-bit codeword, where n is greater than m, such that every codeword has a predefined number of transitions and such that one transition in the codeword has a predefined position.

Thereafter, the encoder converts each n-bit codeword from parallel to serial form for output onto a serial communications channel.

First, identify and define the total set of q different datawords of m-bits each which can be transmitted.

Next, generate all possible conservative codewords of length n bits, where n is greater than m, such that each codeword has known number of transitions, where one transition has a predefined position.

Then select a subset of q different codewords from the possible conservative codewords.

Finally, create a mapping of each dataword to one corresponding codeword.

The inverse mapping will relate each codeword to the corresponding dataword.

With conservative encoding and decoding, the ratio of the total number of bits transmitted to the total number of transitions is known. It is achieved by having a known number of transitions in each block. Another characteristic of a conservative code is a known delimiting transition somewhere within the codeword at a predefined position. The known number of transitions are used in two ways: (i) to count how many bits have arrived, and (ii) to clock these bits in parallel into the receiver's register.

A specific example is illustrative:

Let:

$C = \{C_1, C_2, \ldots, C_n\}$ be a codeword, such that $c_i$ be $+1$ or $-2$.

$T = \{t_1, \ldots, t_b\}$ be the position of the b transitions in each codeword.

One of the transitions $t_i$ ($1 \leq i \leq n$) of each codeword, has a predefined position after the $c_j$ ($1 \leq j \leq n$) bit of each codeword.

NOTE:

1. For b even $$\sum_{i=1}^{i=n} c_i c_{i+1} = n - 2b.$$

2. For b odd there are b−1 (even) internal transitions.

The $b^{th}$ transition is generated by inverting (bit-by-bit) every other codeword.

An example of a specific method of generating all possible conservative codes of length n bits is to determine all possible words of length n bits; determine the number of 1 to 0 and 0 to 1 internal transitions for each possible word; and, select those possible words having b−1 transitions as conservative codewords. The present invention's conservative encoding/decoding system is especially useful as part of the design of a digital electronic interface to a very high speed multiple-access serial link. These high bandwidth comminication links are ususally single mode optical fibers. In optical communications, the system's bottleneck is the digital interface. The present encoding/decoding system and methodology together with the hierarchical interfacing method as discussed in the illustrated embodiment of the present invention make possible many benefits.

These include:

(1) near optimal digital electronic bandwidth such that the critical delay for clocking the interface is minimized to one gate and one flipflop in series;

(2) enabling the incoming serial data to be decoded without explicitly recovering the receiving clock, such as with a phase-locked loop (PLL); and (3) decoding without a PLL. This requires the use of very accurate delay lines. In a very high bandwidth (e.g. hundreds of megabits per second), as illustrated in the present invention, delay lines can be realized very accurately by using transmission lines (TL). Thus, as the serial communication bandwidth gets higher, the PLL becomes less attractive due to its appertuant training period, while the use of delay lines become more attractive by utilizing accurate transmission lines.

BRIEF DESCRIPTION OF THE DRAWINGS

Further features and advantages of the invention will become more readily apparent from the following detailed description, when taken in conjunction with the accompanying drawings, wherein:

FIG. 1 is a block diagram illustrating the three major parts of a conservative code serial data communication system;

FIG. 2 is a block diagram illustrating a conservative code serial data communication system including error detection/correction;

FIG. 3 illustrates a 1-2 pulse-width-modulation (PWM) special case of conservative coding;

FIGS. 13A-H illustrates flow charts for a method of serially communicating digital data, in accordance with one embodiment of the present invention.

DETAILED DESCRIPTION OF THE DRAWINGS

Figure 4:
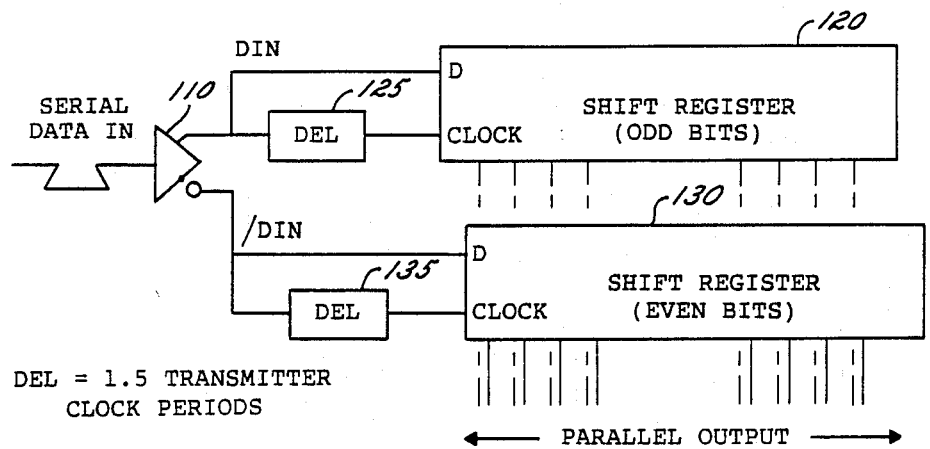
FIG. 4 is a block diagram of a 1-2 PWM link level receiver interface.

Serial communication, in the range of one gigabit/second, is a proven technology, but is not yet implemented. It is reasonable to project, from the rapid progress in solid-state and optical technologies, that within the next 2-5 years such systems will be widely implemented for commercial purposes. The present invention is a practical solution for preserving the time integrity in these systems.

In accordance with the present invention, a new coding methodology and system is presented for preserving the time integrity of serial communications especially over a multiple access channels. These "conservative" codes are characterized by having a known number of transitions, preferably constant and typically even, in each codeword and a known delimiting transition (rising or falling edge) at a predefined location in each codeword, such as at the end of each codeword.

The conservative code enables the receiver and the serial-to-parallel converter to operate without a training period (no preamble is required), i.e., no phase-locked loop is used for clock recovery. Instead, very accurate delay lines are used at the receiving side for decoding and for serial-to-parallel conversion. At very high bandwith, delay lines can be accurately realized by using transmission lines or wave guides.

As illustrated in FIG. 1, the conservative code serial data communication system has three major parts. The central part is the communication channel 10, which carries serial data. The serial data is divided into conservative binary codewords, and transmitted in the channel at two energy levels. The encoder system 20 converts parallel dataword inputs into conservatively encoded codewords which are then serially output to the communication channel 10. The decoder system 30 converts serial data, received from the communications channel 10, into parallel word which are then decoded from conservative codewords into the corresponding respective datawords which are output therefore. The mapping of each dataword is to only one conservative codeword.

The usage of conservative code in serial communication preserves timing information. Other codes are available for use which preserve data integrity. These two coding objectives can be used independently, or can be combined in two levels of transformation. As illustrated in FIG. 2, to combine these methods, the transmitter side, first an error detecting/correcting encoder 50 transformation is applied, and then the conservative code encoder 60 is used for adding the timing information. Then, the conservative code is serially transmitted. At the receiver side, first the conservative code decoder 70 is used for the decoding and serial-to-parallel conversion, and then the error detecting/correcting decoder 80 is applied. These two level of encoding/decoding correspond to the two first levels of the communication protocol. The conservative transformation is part of the physical level interface, while the error detecting/correcting codes are part of the link level protocol.

Two additional embodiments can be added to the conservative encoding scheme (i) balancing each codeword, i.e., having a known ratio between zeros and ones, and (ii) limiting the maximum run-lengths at the high and low level, i.e., the maximum level duration is limited. The purpose of these two restrictions are to limit the DC shift of an AC-coupled receivers and thereby increase the decoding reliability and to decrease the optical receiver complexity. Both constraints can be imposed simultaneously without a significant degradation in encoding efficiency.

Applying the additional constraints of balancing and limited run-length helps to simplify and improve encoder and decoder design. The balancing constraint reduces the number of variables of the encoding/decoding boolean functions from n to n/2. The maximum run-length constraint can reduce the time delay needed for realizing the decoding and encoding of boolean functions.

The application of conservative codes is defined on a block of n bits (let n be even) $a_1, a_2, \ldots, a_n$, with exactly n/2 transitions in every codeword. If $a_1$ can be either $-1$ or $+1$, then the encoding is defined by:

$$\sum_{i=1}^{i=n-1} a_i a_{i+1} = +1$$

and $a_n a_{n+1} = -1$, which define a known transition.

The transitions are used at the receiver side to count how many bits have arrived and to clock them in parallel into a shift register array, with the codeword's known transitions The conservative encoding maps m-bit datawords onto n-bit codewords. Let b be the number of transitions in the codeword. For n even, b maximizes the possible different codewords when $b=n/2$. Given n and m, the number of possible different conservative codewords is, $$\frac{(n-1)!}{(n-b)!(b-1)!}$$

and the values of m, n and b satisfy the following inequality:

$$2^m < \frac{(n-1)!}{(n-b)!(b-1)!}$$

The efficiency of the encoding is the ratio between m and n.

The b transitions of the codeword are used for counting how many bits have arrived in the receiver. If n is exactly divisible by four, then the receiver's codeword bit counter can use only the rising edges or the falling edges. In this case the counter counts to n/4, in order to determine the delimiting transition of a codeword. If n is not exactly divisible by four, the delimiting transition can be determined with a counter that uses both edges, which is more complex and which reduces the digital electronic bandwidth. In the following examples and related discussion, assume that $n=4k$.

As illustrated, the serial interface is full-duplex with transmitting and receiving sides. The design of the interface has five major objectives: (1) To maximize the transmission rate by reducing the critical timing path to one flipflop and one gate. (2) To minimize the number of flipflops which are directly driven by the transmission clock so as to decrease the clock skew. (3) To decode and to perform the serial to parallel conversion of very small packets of data without the training period associated with a phase-locked loop. (4) To minimize the ratio between the transmission clock frequency and the baud rate; i.e., to minimize the DBBRR (Digital Bandwidth to Baud Rate Ratio). (5) To integrate other network control functions in real time; e.g., access control, routing, and buffer management.

These objectives are achieved by two techniques hierarchial interface design and conservative coding. The interface design has four levels, which successively reduce the data path width from the host bus to the optical link. (2) A new family of conservative encoding/decoding system is utilized, characterized by a known number of transitions in every block. These transitions are directly used for decoding the serial data without having to recover the clock by means of a phased-locked loop.

The transformation of the m bits data word into the n bits codeword, and from a codeword back to the original data word can be done by using one look-up table for the encoder, and one for the decoder. These tables can be realized by using two combinational networks, (eg: ROMs). An examplary systematic method for generating these tables is described hereinafter.

Let U be the data word, $U=(u_1\ u_2,\ldots,u_m)$, and C be the codeword, $C=(c_1,c_2,\ldots,c_n)$. Let b be the number of transitions in every codeword.

First, all the different binary data words of length m are listed in their binary order. The maximum size of this list is $2^m$, but since not all possible data words will be included, it is assumed that the list length is $L_{DATA} \leq 2m$. The list of all conversative codewords can be generated as follows. First, a line of length n is divided into n segments, corresponding to the n bits of a codeword. There are $n-1$ possible positions for $b-1$ transitions, i.e., a transition at the end of the first line segment, or the second segment, and so on. The last transition that can be selected is at the end of the $n^{th}$ line segment. The $b^{th}$ transition is the delimiter, and may be at the end of the $n^{th}$ line segment.

Thus, $b-1$ transitions are selected from $n-1$ positions in the codeword.

Let $\{1, 2, 3, \ldots, n-1\}$ be the set of different transition positions in the codeword, (i.e. position one for the transition after the first bit, position $n-1$ for the transition after the $(n-1)^{th}$ bit (after the $n^{th}$ bit there is always a transition) Then, all possible subsets of length $b-1$ are listed in a lexicographical order. There are $$\frac{(n-1)!}{(n-b)!(b-1)!}$$

different subsets.

Next, from the above list of subsets, generate the list of all different codewords. Using the following procedure each subset ($s_j$, $1 \leq j \leq b-1$) is mapped uniquely into a conservative codeword.

Note, that if the number of transitions is even, then there are two equivalent cases: (i) the first bit is always zero, and (ii) the first bit is always one. If the number of transitions is odd, then the first bit alternates, between zero and one. In the following example, codewords are generated such that the first bit is always zero.

LET $v=0$
LET $c_1=0$
DO $i=2$ to n
   IF $i-1$ is an element of $(s_1 \ldots s_{b-1})$
      THEN $v=(v+1)$ modulo 2
   $c_i=v$
END Note that if b is odd, then when transmitting a sequence of codewords, all even codewords should be inverted (or complemented) bit-by-bit, so that delimiting transition would be preserved. At the receiving side, these codewords would then be inverted back to the original codeword.

The size of the conservative codeword list is $$L_{con} \leq \frac{(n-1)!}{(n-b)!(b-1)!}.$$

For proper transformations, $L_{DATA} \leq L_{CON}$. The encoding table is a one to one mapping from the data list to the codeword list. The decoding table is the encoding table in a reverse order. That is, it is an inverse mapping of the encoding function. All the unused codewords can be mapped, so as to generate an error signal, or otherwise utilized.

Note that the one to one mapping is arbitrary, and there are $L_{DATA}!$ (factorial) different possible mappings.

The following is a simple example:

Let $m=4$, $n=7$, and $b=4$, then the list of all possible binary data words is:

0000
0001
0010
0011

0100
0101
0110
0111
1000
1001
1010
1011
1100
1101
1110
1111

The list of all possible codewords is:
0101111
0100111
0100011
0100001
0110111

0110011
0110001
0111011
0111001
0111101
0010111
0010011
0010001
0011011
0011001

0011101
0001011
0001001
0001101
0000101

Then, one possible mapping could be as follows:

| Data Word | Codeword |
|---|---|
| 0000 | 0101111 |
| 0001 | 0100111 |
| 0010 | 0100011 |
| 0011 | 0100001 |
| 0100 | 0110111 |
| 0101 | 0110011 |
| 0110 | 0110001 |
| 0111 | 0111011 |
| 1000 | 0111001 |
| 1001 | 0111101 |
| 1010 | 0010111 |
| 1011 | 0010011 |
| 1100 | 0010001 |
| 1101 | 0011011 |
| 1110 | 0011001 |
| 1111 | 0011101 |
| UNUSED | 0001011 |
| UNUSED | 0001001 |
| UNUSED | 0001101 |
| UNUSED | 0000101 |

The unused codewords may also be used for error detection or for communications control.

Conservative Balanced Code can be easily utilized in accordance with the present invention. Generating the mapping table for the conservative balanced code is done as described before, with an additional step which eliminates the non-balanced codewords from the codeword list, as described in the following procedure:

LET r=0, s=0
DO i=1 to n
IF $c_i=1$,
THEN r=r+1
ELSE s=s+1
END
IF r−s≠{one of predetermined set of values},
THEN take this codeword off the codeword list Note that this set of values may be zero for codewords of even length, or {1, −1} for codewords of odd length.

In the above simple example, with m=4, n=7, b=4, and where the possible differences between the high and low level is +1 or −1, the mapping is as follows:

| Data Word | Codeword |
|---|---|
| 0001 | 0100111 |
| 0010 | 0100011 |
| 0101 | 0110011 |
| 0110 | 0110001 |
| 1000 | 0111001 |
| 1010 | 0010111 |
| 1011 | 0010011 |
| 1101 | 0011011 |
| 1110 | 0011001 |
| 1111 | 0011101 |
| 0000 | 0001011 |
| 0011 | 0001101 |

Note that the following data words are not mapped to any codeword, and therefore cannot be used: 0100, 0111, 1001, 1100.

Limited Run-Length Conservative Code can be easily utilized in accordance with the present invention. Again, generating the mapping table for the conservative code with limited run-length of r, is done as described before, with an additional step which eliminates the codewords with run-length greater than r from the codeword list, as described in the following procedure:

LET u=1
LET v=0
DO i=1 to n−1
IF $C_i=C_{i+1}$,
THEN u=u+1
ELSE u=1
IF u>r,
THEN v=1
END
IF v=1,
THEN take this codeword off the codeword list In the above example with m=4, n=7, b=4 and r=3, the mapping is as follows:

| Data Word | Codeword |
|---|---|
| 0001 | 0100111 |
| 0010 | 0100011 |
| 0100 | 0110111 |
| 0101 | 0110011 |
| 0110 | 0110001 |
| 0111 | 0111011 |
| 1000 | 0111001 |
| 1010 | 0010111 |
| 1011 | 0010011 |
| 1100 | 0010001 |
| 1101 | 0011011 |
| 1110 | 0011001 |
| 1111 | 0011101 |
| 0000 | 0001011 |
| 1001 | 0001001 |

Limited Run-length with Balancing Conservative Coding can also be easily utilized in accordance with the present invention. Again, generating the mapping table for the balanced conservative code with limited run-length of r, is done as described in the following procedure:

```
LET u=0, s=0
DO i=1 to n
    IF c_i=1,
        THEN u=u+1
        ELSE s=s+1
END
IF u−s≠{one of predetermined set of values},
    THEN take this codeword off the codeword list
LET u=1
LET v=0
DO i=1 to n−1
    IF c_i=c_{i+1},
        THEN u=u+1
        ELSE u=1
    IF u>r,
        THEN v=1
END
IF v=1,
    THEN take this codeword off the codeword list
```

In the above example with m=4, n=7, b=4 and r=3, the mapping is as follows:

| Data Word | Codeword |
|-----------|----------|
| 0001 | 0100111 |
| 0010 | 0100011 |
| 0101 | 0110011 |
| 0110 | 0110001 |
| 1000 | 0111001 |
| 1010 | 0010111 |
| 1011 | 0010011 |
| 1101 | 0011011 |
| 1110 | 0011001 |
| 1111 | 0011101 |
| 0000 | 0001011 |
| 0011 | 0001101 |

Note that the following data word are not mapped to any codeword, and therefore cannot be used: 0100, 0111, 1001, 1100.

The realization of the Look-Up Table can be by combinational logic. The Encoder table can be realized by a combinational network with m input variables, and n output variables. The Decoder table can be realized by a combinational network with n input variables, and m output variables.

The following example illustrates the design and analysis of a digital electronic interface to a fiber optic network. The network is a multiple-access medium, realized as a passive optical star, an optical binary tree or a linear bus, and uses serial communication over a single optical fiber. The interface is designed for a maximum baud rate in excess of 1 gigabit/second. The interface is usually the bottleneck of an optical communication system. This design maximizes the bandwidth of the digital interface. Packets are transmitted in bursts, which can be very short.

As illustrated in FIG. 3, the 1-2 pulse-width-modulation (PWM) is a special case of the conservative coding methodology, with exactly one transition for every bit. In this method, zero is encoded as a level for one clock period, and 1 is encoded as a level for two clock periods as shown in FIG. 3.

The decoding circuitry is very simple.

FIG. 4 is a block diagram of a 1-2 PWM link level receiver interface. The serial data is coupled to buffer 110 which provides Din and /Din outputs coupled to shift registers 120 and 130 respectively, and to delay lines 125 and 135 respectively. The delay lines 125 and 135 delay the signals Din and /Din by 1.5 transmitter clock periods prior to the output from the delay lines the respective shift register 120 and 130. Shift 120 register is used for loading the odd bits, and shift register 130 is used for loading the even bits. The outputs of the two shift registers 120 and 130 are combined into one parallel word. Since the transmission length depends on the actual data, and not only on the number of bits in a packet, the baud rate is not constant. The efficiency of this encoding averages 67%, and in worst case is only 50%. Where the transmission is slotted (e.g. TDMA), the worst case efficiency of 50% is assumed.

For practical purposes two additional features can be added to conservative encoding. First, limited run-length, i.e., the maximum duration of the serial signal at a high or low level, is limited to r bits. Secondly, a balanced codeword, which means that each codeword has the same number of low level bits as high level bits.

A very beneficial use of the conservative encoding methodology is in very high bandwidth fiber optic networks. Since fiber optic receivers are usually AC-coupled, using capacitors, an excessive DC level shift can cause errors in the interpretation of serial data. Also, the clock information which is encoded into the serial data must be interpreted accurately. The limited run-length and balanced conservative codeword limits the DC shift, and, therefore, increases the decoding reliability and decreases the optical receivers complexity. Both these constraints can be imposed simultaneously without a significant efficiency degradation.

An example of almost DC balanced code is 4B/5B, which is described in:

S. Joshi and V. Iyer—"New Standards for Loacl Networks Push Upper Limits for Lightwave Data." Data Communications, July 1984, pp. 127-138.

Balanced block encoding method have been proposed, see for example:

D. Knuth—"Efficient Balanced Code." IEEE Trans. on Info Theory, Jan. 1986.

A. Widmer and P. Franaszek—"A DC Balanced, Partitioned-Block, 8B/10B Transmission Code." IBM J. of Res. and Develop., September 1983.

Other codes which contain self clocking information without having a known number of transition are described in:

R. H. Severt—"Encoding Schemes Supporat High Density Digital Data Recording". Computer Design, May 1980, p. 181-190.

H. Sorensen—"Use of Standard Modulation Codes for Fiber Optic Link Optimization." FOC/LAN 1984.

Codes with limited run-length are discussed, for example, in:

S. J. Hong and D. L. Ostapko "Codes for Self-clocking, AC-coupled Transmission: Aspects of Synthesis and Analysis". IBM J. of Research and Development, July 1975

None of these methods attempt to conserve the number of transitions in each codeword.

In high frequency serial communications, the bandwidth of the digital electronic interface is more critical than the bandwidth of the optical subsystem. Therefore, the objective is to have the DBBRR (digital bandwidth to baud rate ratio) as low as possible. Three criteria can be used to evaluate different codes: (1) Resolution—the required sensitivity of the receiver for correct decoding, expressed in terms of a bit-cell. The resolution is the reciprocal value of the DBBRR. (2) DC level—the difference between the time that the transmitted signal is high and the time that the signal is low; it is desirable that this difference be as close as possible to zero. (3) Decoding without a PLL. One of the design objectives is to be able to decode an incoming packet without the training period required by a PLL, which can be substantial at high transmission rates.

In order to match the serial communications link and the host bandwidths the illustrated interface is designed hierarchically with four stages or levels, which control the data path from the host bus to the optical link. At each stage there is a finite state machine for controlling the data path. The requirement for matching is that between adjacent stages the stage closer to the host will be fast enough to serve the stage closer to the optical link. Therefore, if the shift register stage operates at maximum speed and the other stages are fast enough to "serve" it, then the interface has maximum performance.

Figure 5:
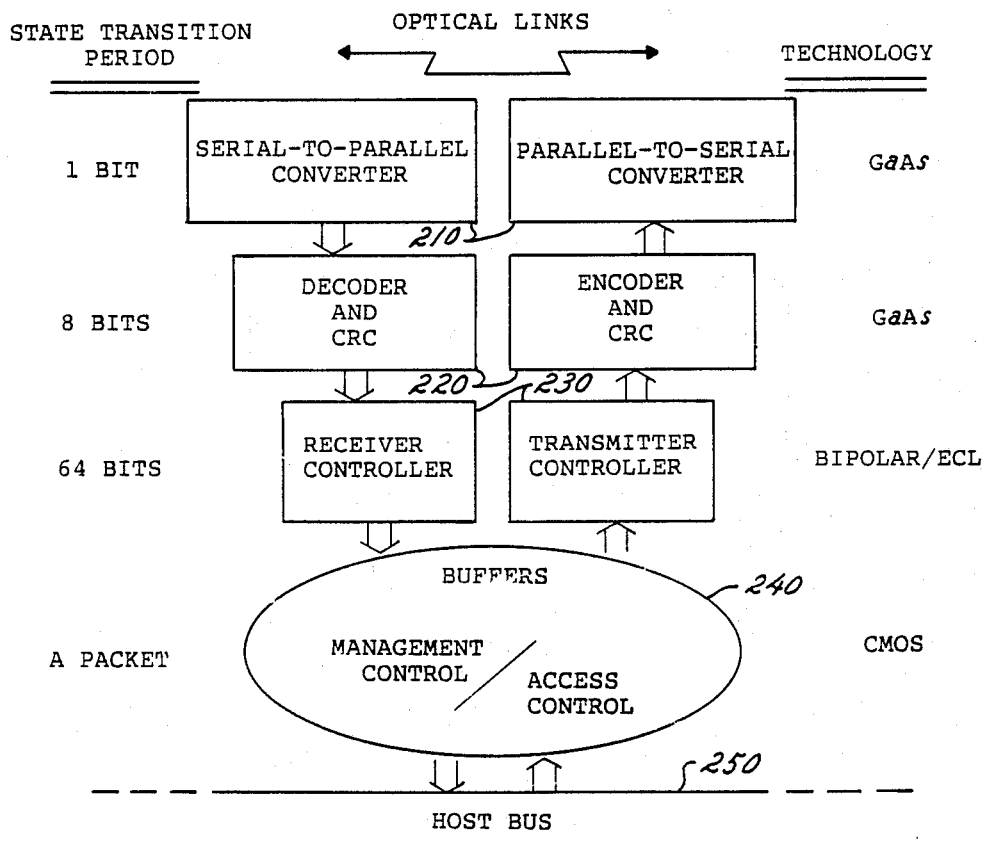
FIG. 5 illustrates the interface stages of an optical communications system in accordance with the present invention in terms of the technology and the maximum time interval allowed for the transition from state to state.

FIG. 5 illustrates the interface stages in terms of two major characteristics: (i) the technology required for realizing the stage, and (ii) the maximum time period (or interval) allowed for the transition from state to state. Referring now to FIG. 5, the Shift register stage 210 is a single bit interval. This is the time for changing the state of the shift register from shift to parallel load, or vice versa. This stage is closest to the optical link, and thus requires a very high speed technology such as GaAs.

The encoding/decoding and CRC generator stage 220 has a width of 8 bits and has a 8 bit-cell interval. This is the interval for performing these functions in parallel on 8 bits of data. This stage feeds the single bit level, is somewhat complex, and should terefore utilize very high speed technology such as GaAs.

The transmitter and receiver finite state controllers level 230 is a 64 bit interval. This is the time for writing or reading a word to or from the transmitter or the receiver. Thus, medium speed bipolar or high speed ECL technology are adequate here.

Finally, the buffer management, routing and access control unit level 240 is a packet length interval for performing these functions in real time. Hence, CMOS or bipolar technology should suffice here.

Figure 6:
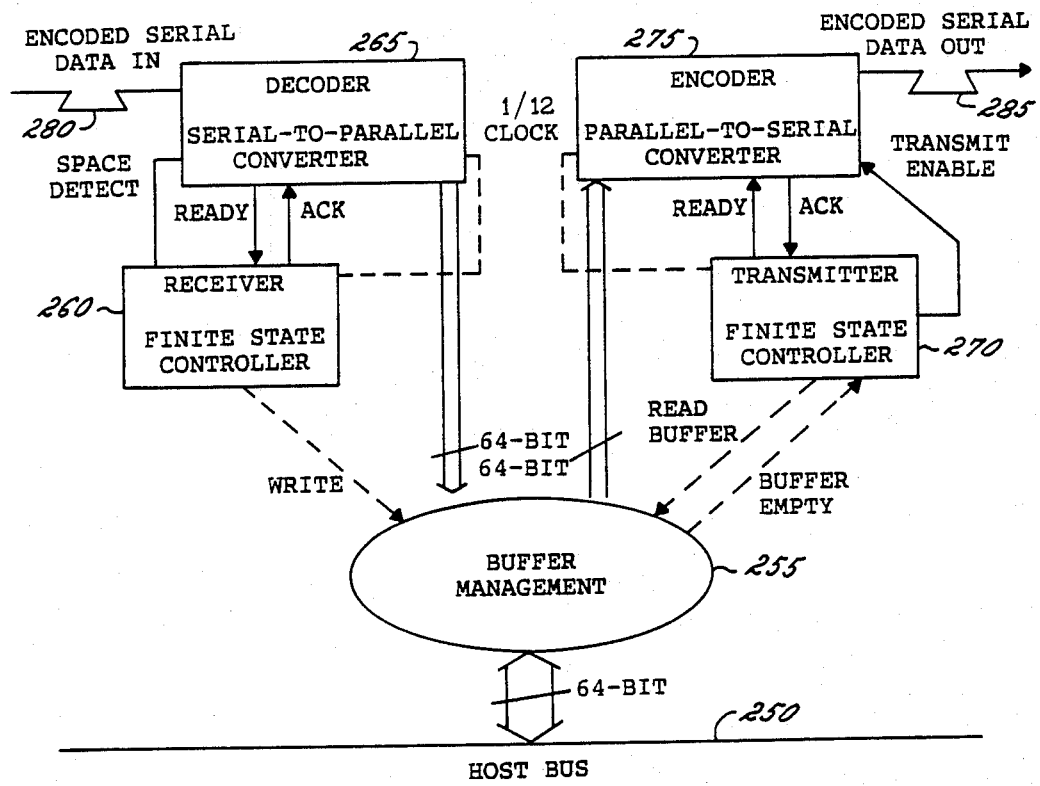
FIG. 6 illustrates a functional block diagram of a full-duplex interface embodiment of the present invention, coupled to a host bus.

FIG. 6 illustrates a functional block diagram of a full-duplex interface, coupled to a Host Bus. A host system is coupled to the Host Bus 250 for bidirectionally coupling data for communications on the Host Bus 250. A buffer management subsystem 255, coupled to the Host Bus 250, stores packets of data prior to transmission and after reception by the respective parts of the serial communications interface. For example, a set of buffers, or FIFOs, can each store one packet of data.

The buffers are dual ported to the Host Bus 250 and to the interface Receiver 260 and Decoder 265, or transmitters 270 and Encoder 275. The Transmitter 270 enables the conservative Encoder subsystem 275 to encode the data from the Buffer 255 into conservative codewords, and to serially transmit the Codewords as an Encoded Serial Data Output 285 onto a very high speed serial communications channel.

The Decoder Subsystem 265 is coupled to receive Encoded Serial Data Input 280 from the serial communications channel.

The Decoder 265 converts the Serial Data Input 280 into parallel codewords, and then decodes the parallel codewords by the inverse of the conservative encoding to provide an output of the respective parallel data words.

The Receiver 260 selectively enables the Decoder 265 to output the decoded parallel data words to the Buffer 255.

A basic question in serial communication is whether to use one or both edges of the clock signal in order to get a better system performance. In general, clock generator modules have the following properties: (1) a clock stability and accuracy better than $+/-0.1\%$, and (2) a clock symmetry accuracy of $+/-5\%$. In high speed serial communications, in order to improve the reliability of the decoding and the parallel-to-serial conversion, it is important that the output signal be as accurate as possible. In the illustrated design, only one of the two clock edges is used, so that the output timing will not depend on the clock symmetry. The present invention can also be utilized with an appropriate two-edge clock generator. In the illustrated design, unary counters are utilized for many functions. The present invention can also be utilized with appropriate binary counters.

Figure 7:
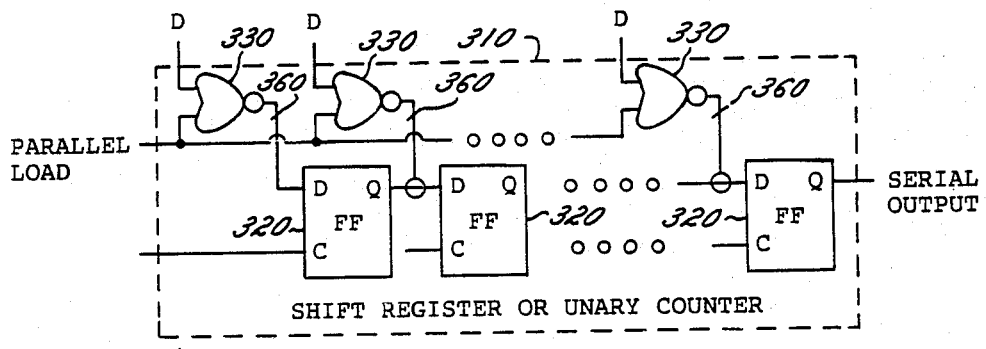
FIG. 7 illustrates the design of a unary counter shift register.

The design of a unary counter shift register is illustrated in greater detail in FIG. 7.

The unary counter 310 is comprised of a shift register comprised of multiple flip-flops 320 which are initally loaded in parallel. All but one of the flip-flops 320 in the unary counter are loaded with zeros. The one remaining flip-flop 320 is loaded with a one. The location of the flip-flop 320 with the one determines the number of counts. For counting up to 16, this type of realization has a much higher bandwidth than the usual binary counter.

Time delays for critical timing sections are minimized by utilizing unary counters comprised of shift registers with a parallel load as illustrated in FIG. 7. The critical delay path of the unary counter is a linear summation (worst case) of three timing delays: (1) the D flip-flop (i.e. D-FF) set up time $-t_{set-up}$, (2) D-FF propagation delay $-t_{FF-del}$, and (3) the NOR-Gate propagation delay $-t_{Nor-del}$. The first two delays occur during operation of the shift register, and the third delay ocurs during the parallel load. The maximum frequency in which the interface can operate is therefore $$BW_{max} = \frac{1}{t_{set-up} + t_{FF-del} + t_{NOR-del}}$$

The shift register 310 is loaded in parallel via a plurality of single NOR-gates 330, each with an output 360 wire-OR coupled to the input of a flip-flop 320, wire-OR coupled to the Q-output of the previous stage flip-flop 320 in the shift register 310. This minimizes the loading delay time. This wire-or configuration is possible because the shift register 310 contains only zeros by the time of the next load.

Figure 8:
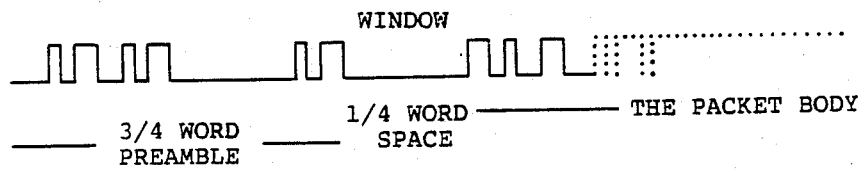
FIG. 8 illustrates a packet header for use with the illustrated embodiments.

The data to be transferred is organized in packets, each of which is a continuous serial stream of bits. As illustrated in FIG. 8, the packet header consists of one word of n bits; the first three quarters of these have some patterns of zeros and ones, and the last quarter of the header is a space. The receiver searches for this space and starts recording data only after it is detected. This technique reduces the effect of random noise.

For simplicity, reliability, and testability, the transmitter and receiver are implemented as two independent submodules; i.e., the network interface is full-duplex. An important consequence of this, for topologies like star, is that a receiver may check its transmitter output, using either an error-detecting code or direct packet-to-packet comparison. Full-duplex interface is necessary for collision detection in random access protocols, such as CSMA/CD.

Figure 9:
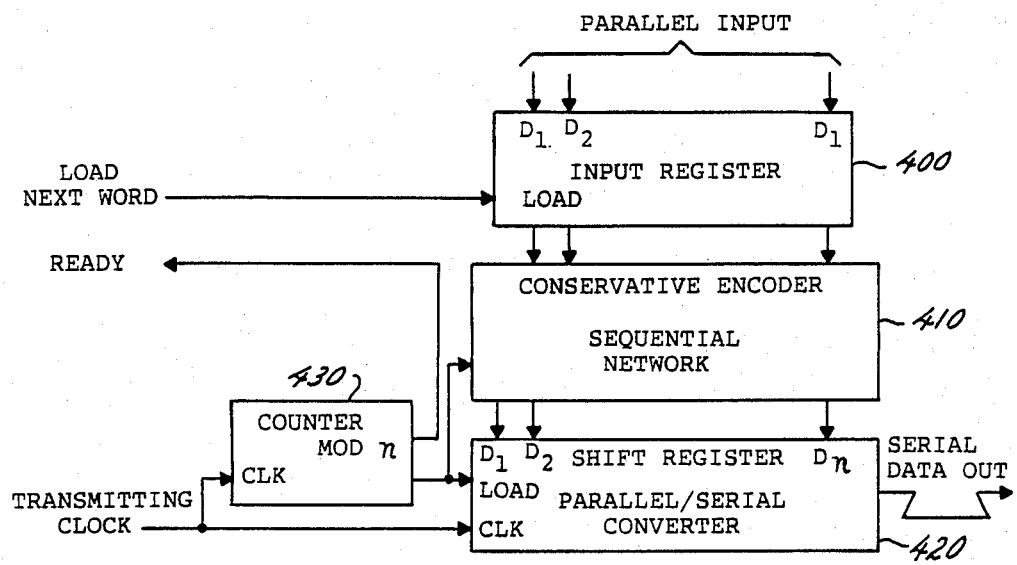
FIG. 9 illustrates a functional block diagram of one embodiment of a transmitter for use with the present invention.

FIG. 9 illustrates a functional block diagram of an embodiment of a transmitter for use with the present invention. In operation, an Input Register 400 is loaded with a parallel dataword input. A Conservative Encoder 410 receives the dataword from the Input Register and encodes the dataword into a conservatively coded codeword. A Parallel to Serial Shift Register 420 loads the codeword in parallel responsive to a Load counter 430, and outputs the codeword as a serial data output synchronized to a transmitting clock signal. The Load Counter 430 counts responsive to the transmitting clock signal and outputs a load signal corresponding to n bits transmitted, where n is the number of bits per codeword.

The transmitter of FIG. 9 can operate in a pipelined manner, such that the Input Register 400 is reloaded and the next codeword is encoded by the Encoder 410, while the Shift Register 420 is serially transmitting the current codeword.

The network can be a simple combinational network. The network can alternatively be a sequential network where some of the network outputs are fed back, appropriately delayed such as via a parallel register, to the input of the network, such that the sequential network outputs the codeword responsive to the data input and the fed back data input.

Figure 10:
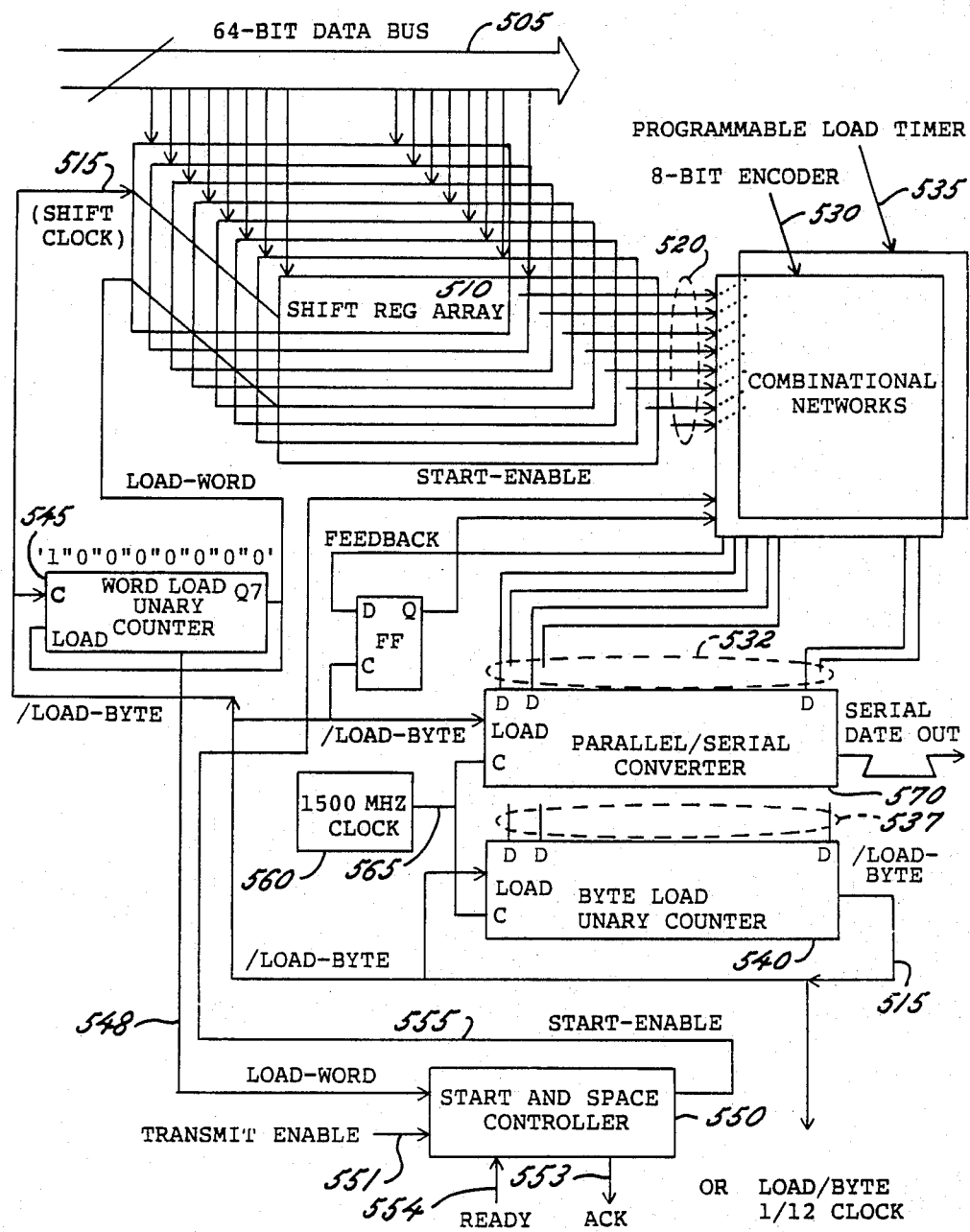
FIG. 10 is a block diagram of a transmitter link interface.

FIG. 10 is a block diagram of the transmitter link interface. A word is loaded in parallel from the data bus 505 into the shift register array 510. The outputs of the shift register array 510 are the inputs to encoder 530 and programmable load timer 535, illustrated as the two combinational networks. The shift register array 510 is clocked by the /LOAD-BYTE signal 515 as output from a Byte-Load Counter 540. A Word Load unary-counter 545 counts /LOAD-BYTE output 515 pulses, and on the $8^{th}$ count a LOAD-WORD output 548 is asserted, On the following /LOAD-BYTE output 515 pulse, the shift register array 510 is loaded with a new word from the parallel data bus 505.

The encoder 530 is enabled responsive to a Start-Enable signal 555. The encoder combinational network 530 receives m bits, output 520, from the shift register array 510, and transforms the m bits into an n-bit conservative codeword output 532. If the START-ENABLE signal output 555 from the Start and Space Controller 550 is deasserted, the output of the encoder network 530 is zero. The n bit codeword output 532 of the encoder 530 is loaded in parallel into a Parallel to Serial Converter 570, which thereafter serially outputs the n bit codeword, responsive to a clock output 565 of a clock 560 illustrated as a 1500 MHZ clock. The converter 570 is loaded responsive to the /Load-Byte output 515 and the clock output 565.

The Programmable Load Timer 535 receives the same m bits, output 520, from the array 510, and transforms the m bits into a multi-bit output word 537 with only one "one." The Programmable Load Timer 535 output word 537 is loaded in parallel into the Byte Load Counter 540 responsive to the /Load-Byte output 515 and the clock output 565. The position of the "one" determines the count time of the Byte-Load Counter 540 until the next /Load-Byte output 515.

Ready and Ack are handshake signals between the transmitter finite state controller and the encoder. 1/12 Clock is the clock of the transmitter finite state controller, which is derived from the transmitting clock, by dividing its frequency by the transmitting period of one byte.

In order to achieve maximum performance in the illustrated examples, all counters are realized as unary counters. There are three unary counters illustrated in the interface in FIG. 10: (i) a Byte Load Counter 140—for determining when to load the next byte into the parallel-to-serial converter 570; (ii) a Word Load Counter 545—for determining when to load the next word into the shift register array 510 (illustrated as comprised of eight shift registers); and (iii) a Space Counter 550—which is part of the "Start and Space Controller" 550, and which determines that the last two bytes of the first word are transmitted as a continuous low level by deasserting the START-ENABLE signal 555.

Another example is encoding 8 bits of data into a 12-bit codeword (8B/12B conservative scheme). Every codeword has: (i) 6 transitions, (ii) the $12^{th}$ bit is always one, and (iii) the first bit is always zero. Hence, every codeword has a falling edge as its delimiter. The number of bits is increased by 50% and the encoding efficiency is 67%. 8 bits of data need 256 different 12-bit codewords. The total number of different possible codewords is $$\binom{11}{5} = 11!/5!6! = 462,$$

which is greater than 256.

Higher order encoding is possible, e.g., 12-bit data into a 16-bit code (12B/16B conservative scheme). These have respective efficiencies of 75% and 80%.

The operation of the interface of FIG. 10 is illustrated in the following detailed example.

The Shift Register Array 510 is part of the bandwidth matching mechanism. A 64-bit dataword (D-D63) is loaded from the data Bus 505 into the Array 510 and the eight least significant bits (rightmost) of each shift register are input to the two combinational networks 530 and 535. The shift registers are clocked by the /LOAD-BYTE signal 515. The Word Load unary-counter 545 counts eight/LOAD-BYTE pulses, on the $8^{th}$ of which LOAD-WORD 548 is asserted. As a result, on the following /LOAD-BYTE pulse, the Array 110 is loaded with a new word from the Data Bus 505.

The Encoder combinational network 530 which receives 8 bits from the Shift Register Array 510, and transforms them into a 12-bit codeword. If the START-ENABLE signal 555 is deasserted, the output of this Encoder 530 is zero. The Programmable Load Timer network 535 receives the same 8 bits from the array and transforms them into an output word with only one 1, whose position determines the time of the next byte load.

The "Start and Space Controller" 550 synchronizes the transmitter interface with the transmitter finite state controller. The START-ENABLE signal 555 is asserted after the rising edge of the /LOAD-BYTE signal 515 if both LOAD-WORD 548 and TRANSMIT-ENABLE 551 are asserted. The READY signal 554 is asserted (by the finite state controller) whenever a new word is ready on the input Data Bus 505, and after ACK 553 is deasserted. The ACK signal is asserted after the rising edge of /LOAD-BYTE 515 if LOAD-WORD 548 is asserted.

The operation of the transmitter link interface of FIG. 10 has four basic phases: idle, start, running, and termination. The Shift Register Array 510, Parallel-to-Serial converter 570, Byte Load Unary-Counter 540 and Word Load Unary-Counter 545 all operate continuously throughout all four phases. Only the Start and Space Controller 550 changes its state during these four phases.

During the Idle phase, TRANSMIT-ENABLE 551 and START-ENABLE 555 are deasserted. As a result, the Parallel-to-Serial Converter 570 is loaded with zeros and the Serial Data Output is continuously low. The Byte Load Unary-Counter 540 is loaded with 1 at the $12^{th}$ position from the right, so that every twelve clock cycles (1500 MHz) there is a pulse (/LOAD-BYTE 515) for one clock period. Every eight pulses, LOAD-WORD 548 is asserted, and the shift Register Array 510 is loaded with a 64 bit word from the Data Bus 505.

During the Start phase, operation is as follows: (1) TRANSMIT-ENABLE 551 is asserted by the transmitter finite state controller. (2) START-ENABLE 555 is asserted after the assertion of LOAD-WORD 548 and /LOAD-BYTE 515. (3) Six bytes of the preamble are transmitted. (4) START-ENABLE 555 is deasserted and two bytes of space are transmitted. (5) START-ENABLE 555 is asserted and the first word of data is transmitted. (6) ACK 553 is asserted.

During the Running phase, data is transmitted continuously. The ACK signal 553 is asserted after the assertion of LOAD-WORD 548. The ACK signal 553 causes the transmitter finite state controller to deassert READY 554, and assert the next data word onto the Data Bus 505, upon which READY 554 is asserted. This causes the Start and Space Controller 550 to deassert the ACK signal 553 in a handshake fashion. The Running phase then begins anew.

During the Termination phase, after the last word is loaded into the Array 110, the ACK signal 553 causes the transmitter finite state controller to deassert both TRANSMIT-ENABLE 551 and READY 554. START-ENABLE 555 is deasserted after the assertion of LOAD-WORD 548 and the rising edge of the /LOAD-BYTE signal 515.

Figure 11:
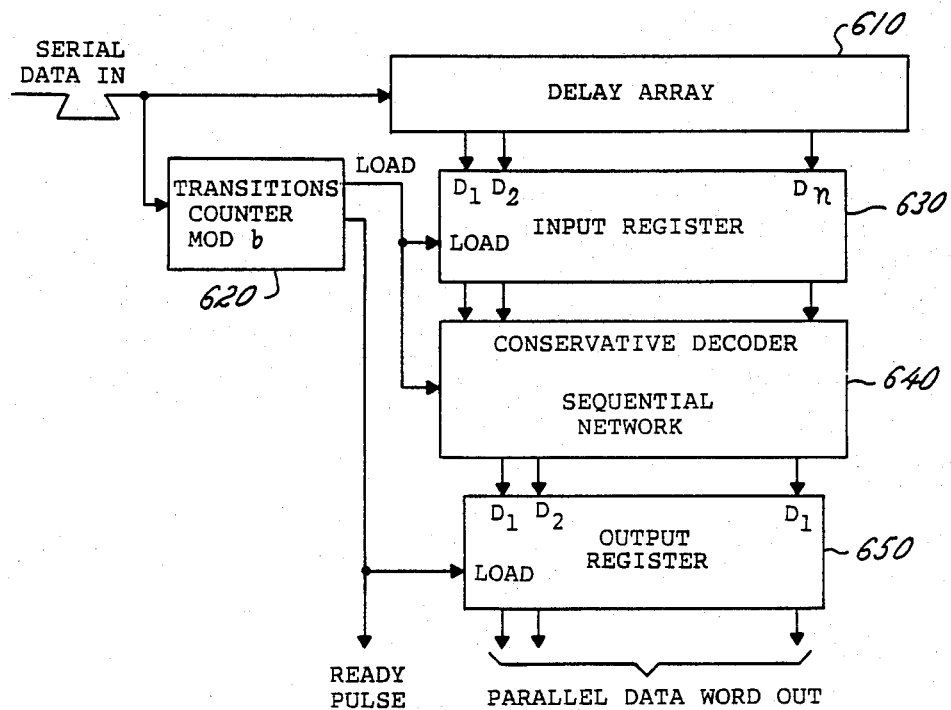
FIG. 11 illustrates a functional block diagram of an embodiment of a receiver for use with the present invention.

FIG. 11 illustrates a functional block diagram of an embodiment of a receiver for use with the present invention. In operation, Serial Data Input, representing the transmitted codewords, is coupled to the receiver's Delay Array 610 and Transitions Counter 620. The Delay Array 610 is n bits in length and has n parallel outputs. The Delay Array 610 shifts the incoming Serial Data In by means of a construction having one bit transmission time delay between each output. The Transitions Counter 620 counts transitions of the Serial Data In, and on the 6th transition outputs LOAD signals coupled to an Input Register 630 and an Output Register 650. These LOAD signals can be the same or then staggered for pipelined operation. The outputs from the Delay Array 610 are loaded in parallel into the Input Register 630 responsive to the LOAD output coupled to the Input Register 630 from the Transitions Counter 620. The Input Register 630 outputs the n-bit parallel codeword, which is input to a Conservative Decoder 640.

The Decoder 640 transforms to conservatively encoded codeword into the corresponding respective decoded data word for output according to the inverse mapping of the conservative encoding. The Decoder 640 output is coupled to Output Register 650 which loads the decoded dataword responsive to the LOAD signal output from the Transition Counter 620 for output in parallel from the Output Register 650.

The receiver of FIG. 11 can operate in a pipelined manner such that the Input Register 630 is reloaded and the next codeword is decoded by the Decoder 640, while the Output Register is outputting the current dataword in parallel.

The Delay Array 610 can be comprised of passive or active electronic delay means, comprised of coaxial, cable with stubs for output spaced at appropriate time delay intervals. Alternatively, circuit board conductor traces can be used in place of coaxial cable. Alternatively, optical fibers appropriately split can be used. Alternatively, active delay arrays can be used such as surface acoustic wave devices.

Figure 12:
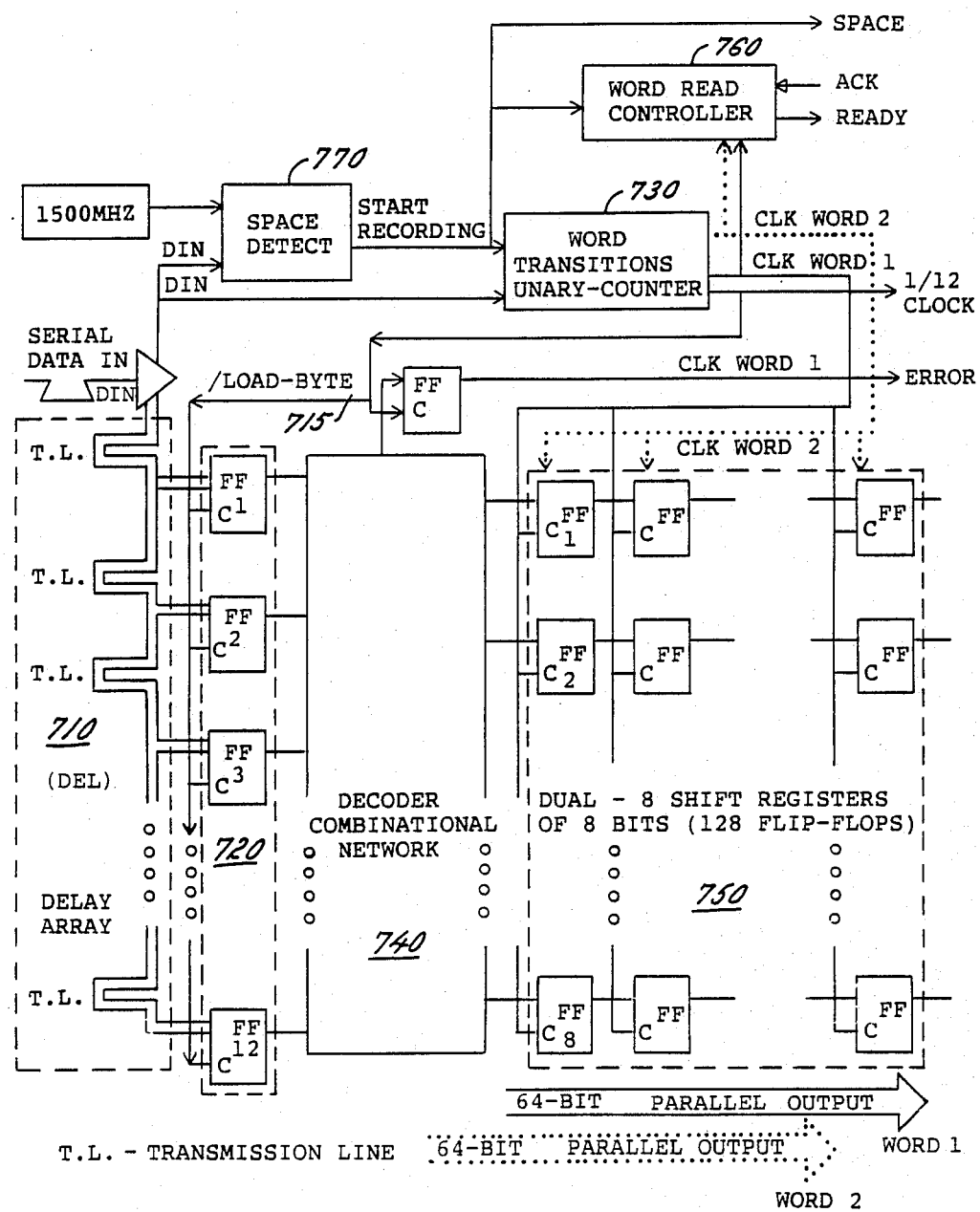
FIG. 12 illustrates a specific 8B/12B decoder example of the receiver as illustrated in FIG. 12.
Figure 13A:
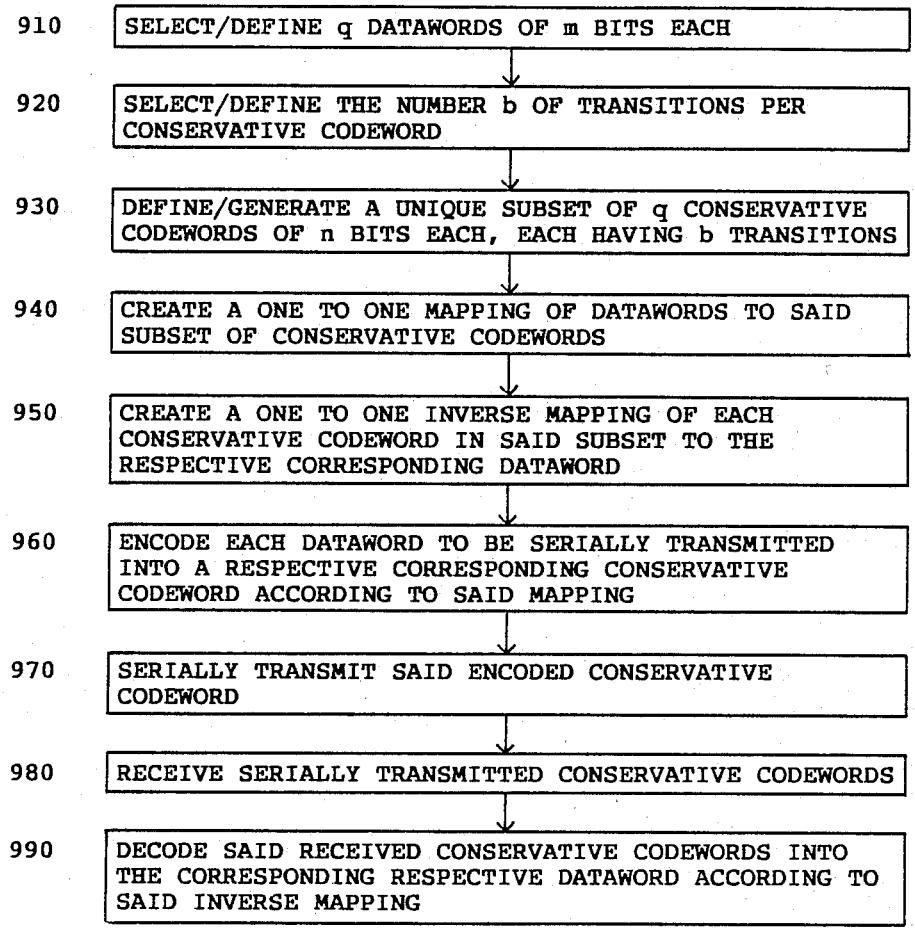
Figure 13E:
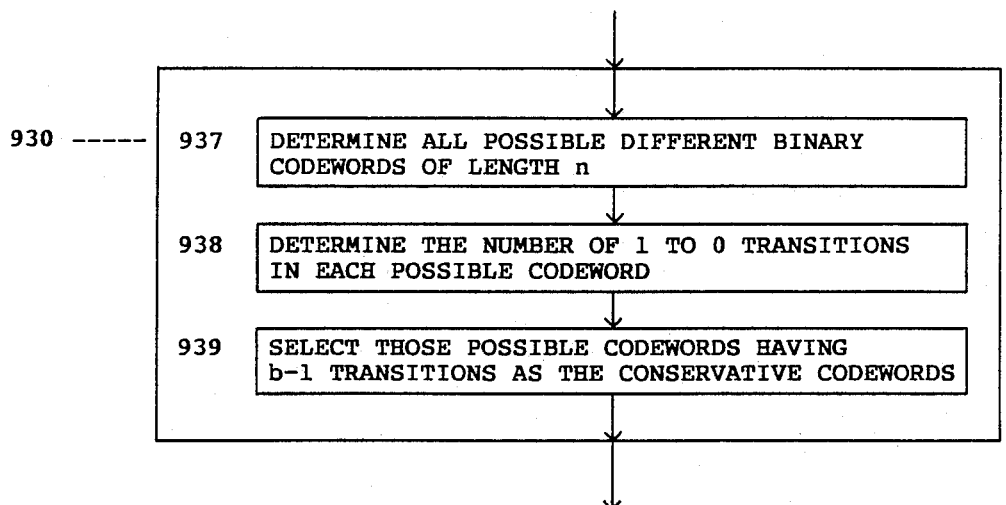
Figure 13F:
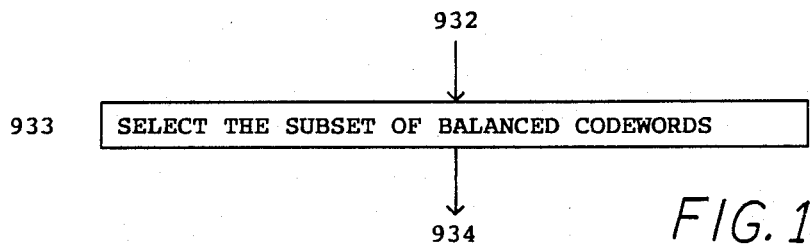
Figure 13G:
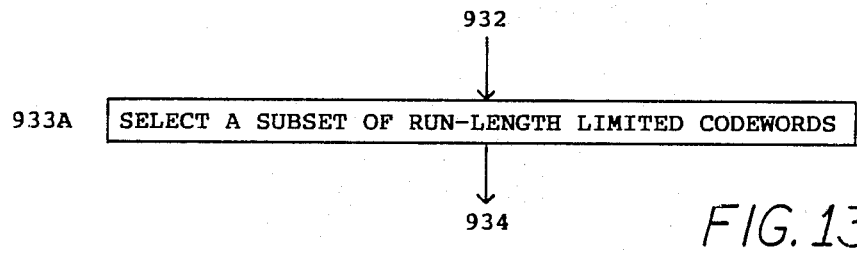
Figure 13H:
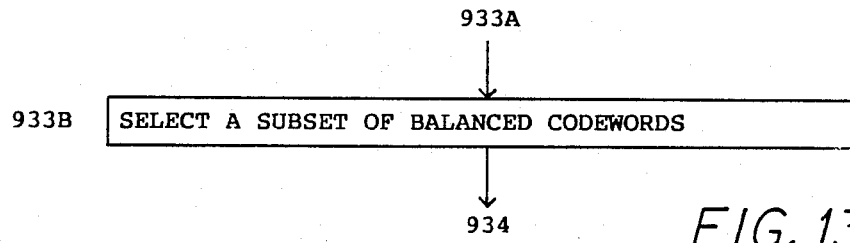

The following description is a specific example of the 8B/12B decoder design as illustrated in FIG. 12. The incoming serial data (Din) has exactly three falling edges for every 8 bits of data (or 12 bits of codeword). The third falling edge is exactly the delimiter of the 8-bit byte. Din is propagated via 12 stages of delay lines (Del), each of which delays the data for 1T. The output of each delay stage is also fed into a D-FF. The falling edge samples the 12 bits into the 12 flipflops. These 12 bits are decoded back to the original 8-bit data by the decoder's combinational network, and then fed into an array of eight shift registers.

A block diagram of the 8B/12B decoder for very high speed operation (e.g. 1 gigabit/sec.) is shown in FIG. 12. From the point of view of the receiver finite state controller this interface and the 1-2 PWM interface of FIG. 4 are the same.

The incoming serial data (Din) has exactly three falling edges for every 8 bits of data (or 12 bits of code). The third falling edge is exactly the delimiter of the 8-bit byte. Din is propagated a Delay Array 710 comprised of 12 stages of delay lines (Del) 710, each stage of which delays the data for one transmission clock period (i.e., 1T). The delay lines can be implemented as a transmission line (i.e. TL) which has 12 evenly space stubs. The output of each delay stage is coupled to an Input Register 720 comprised of 12 D flip-flops (i.e. D-FF).

The Din signal also clocks the Word Transition Unary Counter 730. This counter is designed for maximum bandwidth as described in FIG. 7. The unary counter 730 uses the falling edges of Din, and upon the third falling edge the /Load-Byte signal 715 is asserted, and the 12 bits are sampled from the TL 710 into the 12 input flipflops 720.

The output of the 12 flipflops 720 are decoded back to the original 8-bit data by the Decoder Combinational Network 740, and then fed into Output Register 750 comprised of an array of shift registers. There are two arrays of 8 shift registers for double buffering, each containing a word of 64 bits. The signals CLK Word 1 and CLK Word 2 are respectively used to clock the two arrays of shift registers 750. Only one clock signal is active at a time, and they switch roles after 24 falling edges or after 8 rising edges of the /Load-Byte signal 715 (after 8 bytes of data are recorded). The word in the array which is not being clocked is output and can be read by the receiver finite state controller into the hosts input buffer. ACK and READY The Space Detect unit 770 searches for the space between the preamble and the data in the codeword packet. It uses a shift register with a 1500 MHz clock for recording the incoming serial data into the shift register. A simple combinational network, which uses the shift register outputs, is used to detect the space between the preamble and the body of the packet. This unit sends the signals Start Recording or Space to the receiver finite state controller 760 whenever the space is detected. This signal is also used for resetting the Word Transitions Unary Counter 730.

Error detection is possible, since the codeword space is larger than the data word space (462 words vs. 256 words). If a codeword cannot be mapped to one of the data words, the ERROR signal is asserted.

If a collision has occurred, the high levels of the Din signals are extended (transition information is destroyed), and it can be predicted with a high probability that one of the succeeding input codewords is illegal.

The 1/12 Clock from the Word Transitions Unary Counter 730 is the clock signal to the receiver finite state controller 760. Hence the operation of these two units are synchronized. While the input line is idle, the 1/12 Clock is derived from the 1500 MHz clock.

The 12 input flipflops 720 can be realized by one integrated circuit (IC), so they can be clocked simultaneously by the /Load-Byte signal 715. The transmission line (TL) can be realized on a printed circuit (PC) board, with each of its segments is about 15–20 cm., so the delay of each segment can be adjusted externally by changing its length.

The temperature stability of the TL determines the stability of the delays between the input flipflops. The PC board is thermally more stable than active devices, since it has a significant thermal inertia. The size and passive nature of the TL would suggest that it is much easier to stabilize at a constant temperature than either an active dlay line or RC circuits.

The lines which connect the discrete devices are transmission lines which have very accurate characteristic impedance, and these can be used as highly accurate delay lines. The delays for the illustrated design are less than one nanosecond, which can be realized by less than 20 cm of transmission line on a printed circuit board.

It is important to note that as illustrated and described with reference to FIG. 12, the 1500 MHz clock is not used for decoding or parallel-to-serial conversion. It is used only for control and error checking. The decoding and converting circuitry is completely asynchronous and can operate within the tolerances of the delay lines.

The basic principle of the conservative code receiver interface operation is to use the transition information of the incoming data both for decoding and for serial-to-parallel conversion. Receiver designs are presented for both the 1-2 PWM (regarding FIG. 4) and 8B/12B Conservative encoding (regarding FIG. 12).

The critical timing section of the transmitter is small enough to be implemented on a single GaAs gate-array, and the transmitting clock need drive only this chip. Similarly, the critical timing section of the decoder (the unary counter, input flip-flops and shift/hold control) can be integrated on another single GaAs chip. The hierarchical design allows the use of CMOS technology and the integration of network control algorithms into the interface.

The use of unary counters (shift registers) achieves maximum transmission rate in a given technology. They should be relatively small, in order to avoid clock skew delay. Again, the hierarchical design methodology makes this possible.

The conservative encoding/decoding methodology of the present invention is flexible, stable and simple enough to be used in a multiple-access medium. The decoder uses delyas realized by transmission lines. This realization is simpler as the delay becomes shorter, and therefore favors high baud rates (as long as the pulse dispersion is not significant).

The methodology and system disclosed preserves the time integrity in very high speed serial communications systems. This system and method is applicable to a wide range of applications, including optical communication. The present encoding/decoding implementation becomes simplier as the bandwidth increases, as opposed to coding methods that use a phase-locked loop which typically require a longer training period (i.e. preamble) as bandwidth increases.

Especially beneficial uses of the present system include communications over a multiple access medium, e.g., optical star; low noise mediums, e.g., optical fibers; point-to-point communication having a bandwidth greater than one gigabit/second; and serial links to a high bandwidth input/output devices, e.g., optical disks and magnetic disks.

Although this invention has been described with reference to the illustrated embodiments, this description is not meant to be constructed in a limiting sense. Various modifications of the disclosed embodiments, as well as other embodiments of the invention, will become apparent to those skilled in the art upon reference to the drawings and description of the invention. It is therefore contemplated that the appended claims will cover any such modifications as fall within the true scope of the invention.

What is claimed is:

1. A system for serial communications comprising:
   encoder means for outputting, as a serial bit stream, conservative encoded codewords each having a predefined number of transitions, responsive to a parallel data input;
   decoder means for outputting, in parallel, decoded data words responsive to the serial bit stream of conservative encoded codewords; wherein,
   each codeword has a plurality of transitions as serially transmitted, and wherein the ratio is known between the total number of bits per codeword transmitted and the total number of transitions per codeword in the serial bit stream.

2. The system as in claim 1 further comprising:
   channel means, coupled to the encoder and the decoder means, for providing a medium for transferring the serial bit stream from the encoder to the decoder means.

3. The system as in claim 1 wherein some of said transitions occur at known intervals in the serial bit stream.

4. The system as in claim 3 wherein the known interval is at predefined intervals in the serial bit stream.

5. The system as in claim 3 wherein the known intervals are determined by the encoder means responsive to previously input datawords.

6. The system as in claim 3 wherein the known intervals are determined by the decoder means responsive to previously transmitted codewords.

7. The system as in claim 1 wherein each codeword is balanced, where in each codeword the difference between the number of high bits and the number of low bits has one of a predefined set of values.

8. The system as in claim 1 wherein each codeword is run-length limited.

9. The system as in claim 7 wherein each codeword is run-length limited.

10. The system as in claim 1 wherein the encoding means is further comprised of:
    means for transforming an m-bit parallel input dataword into an n-bit codeword, where n is greater than m, such that every codeword has a known number of transitions and such that one transition in the codeword has a known position; and
    means for converting the n-bit codeword from parallel to serial form for output.

11. The system as in claim 10 wherein said known number of transitions is predefined.

12. The system as in claim 10 wherein the encoding means is further characterized in that said predefined number of transitions is b, where $b<n$.

13. The system as in claim 10 wherein each codeword is balanced.

14. The system as in claim 10 wherein each codeword is run-length limited.

15. The system as in claim 12 wherein each codeword is run-length limited.

16. The system as in claim 1 further comprising:
    means for adding error detection data to the parallel data input prior to said encoding, responsive to said parallel data input; and
    means for selectively detecting errors and for removing said error detection data from said parallel decoded data, responsive to said decoder means output.

17. A system for serially transmitting a codeword over a high speed serial communications channel, responsive to a parallel input m-bit dataword, comprising:
    means for transforming the m bit parallel dataword into an n-bit codeword, where n is greater than m, such that every codeword has a predefined number of transitions and such that one transition in the codeword has a known position; and
    means for converting the n-bit codeword from parallel to serial form output.

18. The system as in claim 17 wherein said predefined number of transitions is b, such tht $b>n$.

19. The system as in claim 17, wherein each codeword is balanced.

20. The system as in claim 17 wherein each codeword is run-length limited.

21. The system as in claim 20 wherei each codeword is also balanced.

22. A conservative code communications transmitter, coupled to receive a parallel dataword input, comprising:
    an input register for storing said dataword;
    encoding means, coupled to said input register, for selectively encoding said dataword into a conservative codeword having a predefined number of transitions, said codeword having more bits than said respective dataword, each codeword corresponding to one dataword; and
    means for converting said codewords from parallel to serial form for output as a serial data bit stream.

23. A method of serially communicating digital data comprising the steps of:
    selecting a subset of q parallel datawords, of m bits each, which can be transmitted;
    generating a subset of q unique parallel conservative codewords of n bits each, each having a predefined number of transitions;
    mapping each dataword to one corresponding codeword;
    inverse mapping each codeword to the corresponding dataword;
    encoding each dataword into a codeword for serial transmission according to the mapping;
    serially transmitting the codewords; and
    receiving and decoding each serially transmitted codeword into the corresponding dataword according to the inverse mapping.

24. The method as in claim 23 wherein the step of defining conservative codewords is further comprised of the step of:
    generating all possible conservative codewords of length n bits, wherein n is greater than m, such that each codeword has exactly b transitions.

25. The method as in claim 24 further comprising the step of:
    selecting only the codewords which have a predefined transition in a predefined position of the codeword.

26. The method as in claim 25 further comprising the step of:
    selecting a subset of q codewords from the possible conservative codewords.

27. The method as in claim 25 wherein the predefined position is after the last bit.

28. The method as in claim 24 further comprising the step of:
    inverting, for $b=$odd, bit by bit, every other codeword, after encoding and prior to serial transmission, and, after reception and before decoding.

29. The method as in claim 24 wherein the step of generating all possible conservative codes of length n bits is further comprised of the steps of:
    determining all possible different binary words of length n bits;
    determining the number of 1 to 0 and 0 to 1 transitions in each possible codeword;
    selecting those possible codewords having $b-1$ transitions as conservative codewords.

30. The method as in claim 29 wherein the $b^{th}$ transition follows the last bit of the codeword.

31. The method as in claim 24 wherein the step of selecting a subset of q codewords is further comprised of the step of:
    selecting a balanced subset of codewords from the conservative codewords.

32. The method as in claim 24 wherein the step of selecting a subset of q codewords is further comprised of the step of:
    selecting a run-length limited subset of codewords from the conservative codewords.

33. The method as in claim 32 further comprised of the step of:
    selecting a balanced subset of codewords from the conservative codewords.

34. A receiver system, for serial communications of a bit stream of n-bit conservatively encoded codewords corresponding to respective m-bit datawords, coupled to receive serial data input from an external communications channel, comprising:

delay means for selectively outputting an n-bit codeword in parallel from a delay array responsive to the input bit stream, each codeword having a predefined number of transitions;

conservative decoder means for decoding said codewords and for outputting the corresponding m bit parallel datawords responsive to said delay means.

35. The receiver system as in claim 34 wherein the delay array outputs are time-offset from each other by 1-bit cell time.

36. The system as in claim 34 further comprising:
means for selectively outputting a load signal responsive to counting a known number of transitions in the serial bit stream, wherein said decoder means is responsive to said delay means and said load signal.

37. The system as in claim 34 wherein said delay array is comprised of transmission lines.

38. The system as in claim 37 wherein said transmission lines are coaxial cable.

39. The system as in claim 37 wherein said transmission lines are circuit board conductor traces.

40. The system as in claim 34 wherein said delay array is fiber optic waveguides.

41. The system as in claim 34 wherein said delay array is a passive electronic delay array.

42. The system as in claim 34 wherein said delay array is an active electronic delay array.

43. The system as in claim 34 wherein said delay array is a surface acoustic wave dalay array.

44. The system as in claim 34 wherein said delay array is comprised of:
delay elements in series.

45. The system as in claim 34 wherein said delay array is comprised of:
delay elements in parallel.

46. The system as in claim 34 wherein said delay array is comprised of:
delay elements in series and in parallel.

* * * * *